(12) United States Patent
Ramakrishnan

(10) Patent No.: US 6,492,860 B1
(45) Date of Patent: Dec. 10, 2002

(54) LOW VOLTAGE CMOS ANALOG SWITCH

(75) Inventor: Shankar Ramakrishnan, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/626,013

(22) Filed: Jul. 25, 2000

(51) Int. Cl.$^7$ .............................................. H03K 17/62
(52) U.S. Cl. ........................ 327/404; 327/427; 327/576; 327/437
(58) Field of Search ................................. 327/404, 403, 327/376, 377, 379, 405, 419, 425, 427, 434, 436, 437, 576, 581, 583; 526/31, 33, 34

(56) References Cited

U.S. PATENT DOCUMENTS

| | | | |
|---|---|---|---|
| 4,611,135 A | * 9/1986 | Nakayama et al. | 327/391 |
| 5,023,688 A | * 6/1991 | Ando et al. | 257/350 |
| 5,065,057 A | * 11/1991 | Kawasaki | 327/389 |
| 5,289,062 A | * 2/1994 | Wyland | 327/389 |
| 5,506,528 A | * 4/1996 | Cao et al. | 327/108 |
| 5,517,150 A | * 5/1996 | Okumura | 327/427 |
| 5,617,055 A | * 4/1997 | Confalonieri et al. | 327/404 |
| 6,154,085 A | * 11/2000 | Ramakrishnan | 327/404 |
| 6,163,199 A | * 12/2000 | Miske et al. | 327/434 |

* cited by examiner

Primary Examiner—Timothy P. Callahan
Assistant Examiner—Hai L. Nguyen
(74) Attorney, Agent, or Firm—Perkins Coie LLP

(57) ABSTRACT

A low voltage analog switch having low leakage off-current and including a first transmission gate having a first N-channel transistor and a first P-channel transistor, each first and second transistor having respective drain and source terminals coupled together to form switch drain and source terminals, and a second transmission gate having a second N-channel transistor coupled in series to a second P-channel transistor coupled in series to a third N-channel transistor, the second transmission gate being coupled in parallel to the first transmission gate, the gates of the second and third N-channel transistors being coupled to the gate of the first N-channel transistor and a gate of the second P-channel transistor being coupled to the gate of the first P-channel transistor. In another embodiment, the second transmission gate includes a second P-channel transistor coupled in series to a second N-channel transistor coupled in series to a third P-channel transistor, the second transmission gate being coupled in parallel to the first transmission gate, the gates of the second and third P-channel transistors being coupled to the gate of the first P-channel transistor and a gate of the second N-channel transistor being coupled to the gate of the first N-channel transistor.

20 Claims, 2 Drawing Sheets

LOW VOLTAGE CMOS ANALOG SWITCH

FIELD OF THE INVENTION

The present disclosure relates to CMOS analog switches and more particularly to a low voltage, low leakage CMOS analog switch employing low threshold devices.

BACKGROUND OF THE INVENTION

Battery-powered operation and low voltage digital circuits have motivated the design of low voltage analog circuits. Analog integrated circuits are generally implemented using switched-capacitor techniques employing transmission gate switches. The ability of transmission gates to conduct reliably in the rail-to-rail range imposes a lower limit upon low voltage operation. The disclosed embodiments of a new transmission gate overcome this limitation and allow for operation with voltages as low as 1V.

A conventional CMOS transmission gate consists of an N-channel and a P-channel enhancement MOSFET connected in parallel. The respective drains and sources of the two transistors are tied together to become the switch terminals while the gates of the two transistors are usually driven to the power supply rails such that they are of complementary polarity. When the gate of the N-channel MOSFET is driven to the positive rail and the gate of the P-channel MOSFET is driven to the negative rail, the switch is on. When the gate of the N-channel MOSFET is driven to the negative rail and the gate of P-channel MOSFET is driven to the positive rail, the switch is turned off.

The "on" resistance of the transmission gate is a function of the device sizes, supply voltage, signal voltage and the threshold voltages of the MOSFETs. For the switch to have a finite "on" resistance over the entire range of the signal voltage, the sum of the magnitudes of the threshold voltages of the N-channel MOSFET and the P-channel MOSFET, $V_{TN}+|V_{TP}|$, must be less than or equal to the supply voltage. For low voltage operation (<1.5V), $V_{TN}+|V_{TP}|$ is therefore constrained to be less than 1.5V over process and temperature variations. However, reducing the threshold voltages of the devices results in the exponential increase of the sub-threshold leakage when the transmission gate is turned off.

In order to ensure that sub-threshold leakage is negligible, it is necessary to keep $V_{TN}>0.5V$ and $V_{TP}<-0.5V$ over all process corners and temperatures. Given the typical process variations, these constraints are very difficult to achieve without unacceptable yield loss. It is generally not possible to satisfy both constraints simultaneously because the imposed limits are very tight over process variations and temperature. Moreover, for a 1.2V supply voltage, it is impossible to satisfy both threshold voltage constraints simultaneously.

Prior art solutions to this problem generally comprise increasing the gate voltage (i.e., clock multiplication) or reducing the leakage off-current. As disclosed in Bazarjani et al., "Low voltage SC Circuit Design with Low-$V_t$ MOSFETs", known methods of reducing the leakage off-current include limiting the signal swing, adjusting $V_T$ by back bias, providing a series transmission gate switch and a parallel/series transmission gate. In particular, Bazarjani et al. disclose a parallel transmission gate using high $V_T$ MOSFETs along with a series transmission gate switch using low $V_T$ MOSFETs. The disclosed transmission gate does not however reduce leakage off-current in the case where the signal is close to or equal to the negative supply rail.

There therefore exists a need for an analog switch capable of low voltage operation which substantially reduces leakage off-current over the entire signal range.

SUMMARY OF THE INVENTION

A parallel/series transmission gate using high $V_T$ MOSFETs in the parallel transmission gate and low $V_T$ MOSFETs in the series transmission gate is useful for general purpose signal routing. The series transmission gate includes either a P-channel MOSFET, N-channel MOSFET, P-channel MOSFET series configuration or an N-channel MOSFET, P-channel MOSFET, N-channel MOSFET series configuration. The disclosed embodiments substantially reduce leakage off-current. For low threshold voltage N-channel MOSFETs having $V_{TN'}=V_{TN}-\Delta V_{TN}$ and low threshold voltage P-channel MOSFETs having $|V_{TP'}|=|V_{TP}|-\Delta V_{TP}$, the minimum required supply voltage for the "on" condition is reduced by the lower of ($\Delta V_{TN}$, $\Delta V_{TP}$). Additionally, the leakage current of the series transmission gate is less than or equal to the leakage current of the parallel transmission gate for the same device geometries as long as the supply voltage is greater than $\Delta V_{TN}+\Delta V_{TP}$. To provide for both finite "on" resistance and low leakage current, both of the above constraints are satisfied and the resulting supply voltage is the lower of $\Delta V_{TN}+\Delta V_{TP}$ and the minimum supply voltage reduced by the lower of ($\Delta V_{TN}$, $\Delta V_{TP}$).

DETAILED DESCRIPTION

Figure 1:
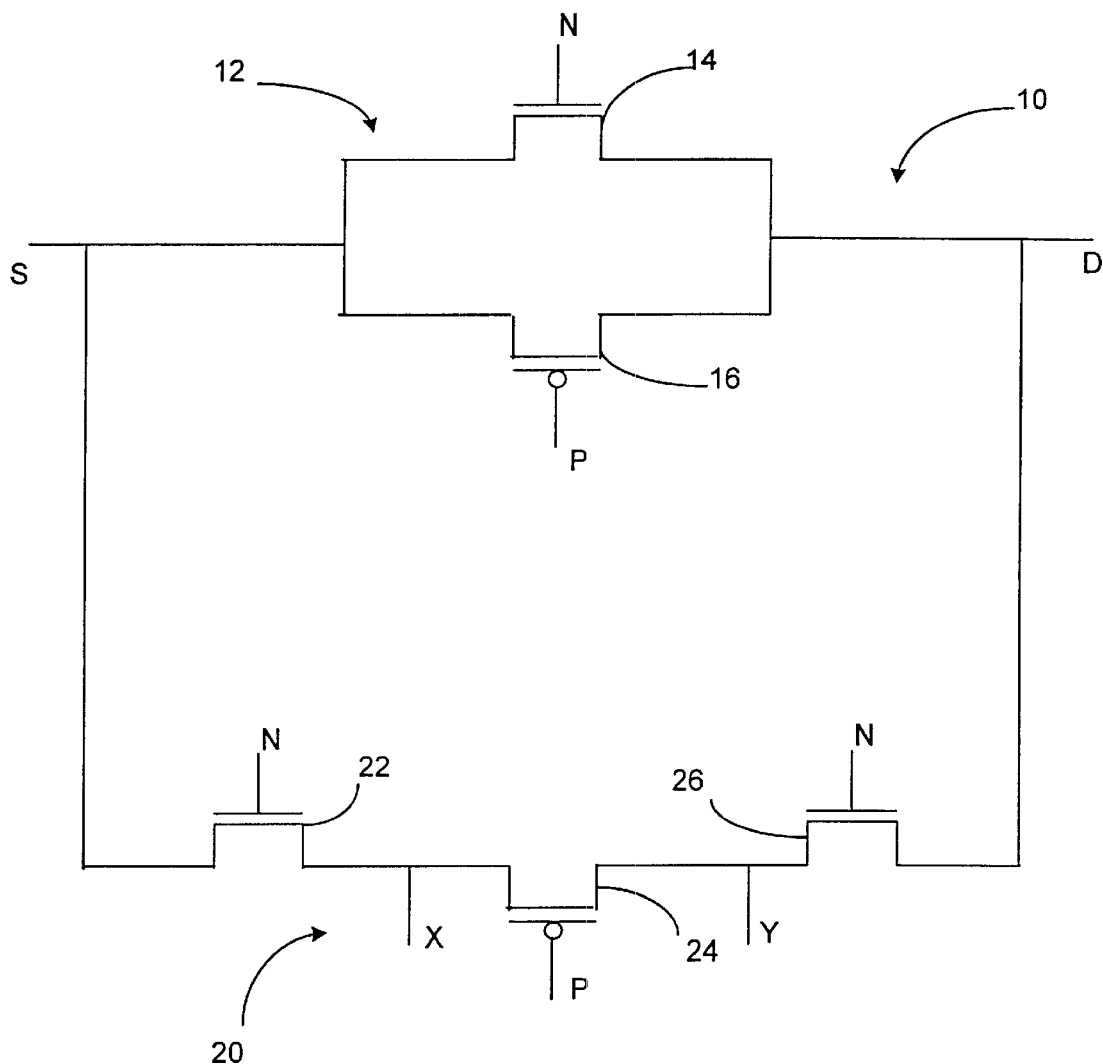
FIG. 1 is a schematic view of a first embodiment of a low voltage analog switch.

Referring first to FIG. 1, a first embodiment of a low voltage analog switch is shown generally as 10. A conventional transmission gate generally designated 12 includes a first N-channel MOSFET 14 connected in parallel to a first P-channel MOSFET 16. The threshold voltage of the first N-channel MOSFET 14 is $V_{TN}$ and the threshold voltage of the first P-channel MOSFET 16 is $V_{TP}$. The respective drains (D) and sources (S) of the two transistors 14 and 16 are tied together to become the switch terminals while the gates of the two transistors N and P are usually driven to the power supply rails such that they are of complementary polarity. A series transmission gate generally designated 20 is connected in parallel to transmission gate 12 and includes a series combination of a second N-channel MOSFET 22 having a low threshold voltage $V_{TN'}$, a second P-channel MOSFET 24 having a low threshold voltage $V_{TP'}$, and a third N-channel MOSFET 26 having a low threshold voltage $V_{TN'}$. As shown, the gates of the N-channel MOSFETs 14, 22 and 26 are tied together and the gates of the P-channel MOSFETs 16 and 24 are tied together.

Figure 2:
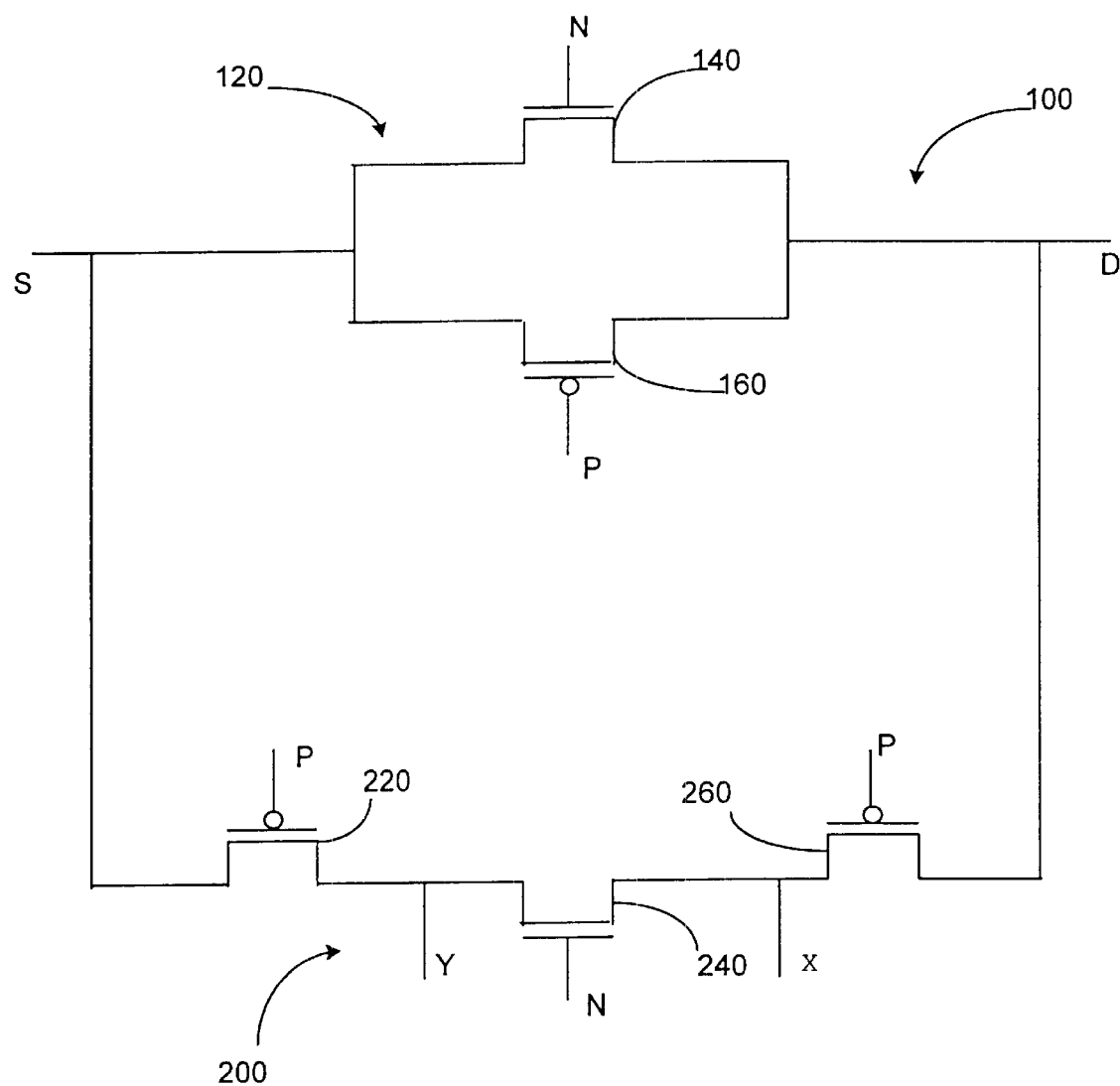
FIG. 2 is a schematic view of a second embodiment of a low voltage analog switch.

Referring to FIG. 2, a second embodiment of a low voltage analog switch is shown generally as 100. A conventional transmission gate generally designated 120 includes a first N-channel MOSFET 140 connected in parallel to a first P-channel MOSFET 160. The threshold voltage of the first N-channel MOSFET 140 is $V_{TN}$ and the threshold voltage of the first P-channel MOSFET 160 is $V_{TP}$. The respective drains (D) and sources (S) of the two transistors 140 and 160 are tied together to become the switch terminals while the gates of the two transistors N and P are usually driven to the power supply rails such that they are of complementary polarity. A series transmission gate generally designated 200 is connected in parallel to transmission gate 120 and includes a series combination of a second P-channel MOSFET 220 having a low threshold voltage $V_{TP'}$, a second N-channel MOSFET 240 having a low threshold voltage $V_{TN'}$, and a third P-channel MOSFET 260 having a low threshold voltage $V_{TP'}$. As shown, the gates of the N-channel MOSFETs 140 and 240 are tied together and the gates of the P-channel MOSFETs 160, 220 and 260 are tied together.

With regard to either embodiment, assuming the negative supply voltage is 0 and the positive supply is $V_{cc}$, transmission gate (12, 120) is on over the signal range $|V_{TP}|$ to $V_{cc}-V_{TN}$. For the same supply voltage, transmission gate (20, 200) is on over the signal range $|V_{TP'}|$ to $V_{cc}-V_{TN'}$. To ensure that at least one of the gates (12,120) and (20,200) is on over the entire range of 0 to $V_{cc}$, the following conditions must be satisfied:

$$V_{cc}-V_{TN} > |V_{TP}|$$

and $$|V_{TP'}| < V_{cc}-V_{TN'}.$$

Substituting $V_{TN'} = V_{TN} - \Delta V_{TN}$ and $|V_{TP'}| = |V_{TP}| - \Delta V_{TP}$ yields $$V_{cc}-V_{TN} > |V_{TP}| - \Delta V_{TP}$$

and $$|V_{TP}| < V_{cc} - V_{TN} + \Delta V_{TN}.$$

The last two equations can be rearranged as $$V_{cc} > V_{TN} + |V_{TP}| - \Delta V_{TP}.$$

and $$V_{cc} > V_{TN} + |V_{TP}| - \Delta V_{TN}$$

Therefore the improvement in supply voltage for the "on" condition is the smaller of $\Delta V_{TP}$ and $\Delta V_{TN}$.

Assuming that the "off" leakage of the conventional transmission gate (12,120) is low enough to be taken as the benchmark for the "off" leakage of the series transmission gate (20,200) and further assuming that all the leakage of series transmission gate (20,200) is due to sub-threshold conduction of transistors (22,220), (24,240) and/or (26,260), for sub-threshold leakage current flowing from terminal S to terminal D (FIGS. 1 and 2), terminal X is the source side of MOSFETs (24,240) and (22,260). With the above assumptions, the voltage at node X (Vx) should satisfy the following two constraints $$Vx > V_{cc} - \Delta V_{TP} \text{ (for P-channel MOSFET sub-threshold conduction)}$$

and $$Vx < \Delta V_{TN} \text{ (for N-channel MOSFET sub-threshold conduction)}$$

Combining the two inequalities yields:

$$\Delta V_{TN} > V_{cc} - \Delta V_{TP}$$

or $$V_{cc} < \Delta V_{TN} + \Delta V_{TP}.$$

Therefore, if $V_{cc} > \Delta V_{TN} + \Delta V_{TP}$ there is no sub-threshold current flow from S to D.

For sub-threshold current flowing from D to S, terminal Y is the source side of MOSFETs (24,240) and (26,220). Because of symmetry, the above inequalities are valid with Vy replacing Vx. As above, if $V_{cc} > \Delta V_{TN} + \Delta V_{TP}$ there is no sub-threshold current flow from D to S.

The described embodiments are to be considered as illustrative and not restrictive, and the invention is not to be limited to the details given herein, but may be modified within the scope of the appended claims. In particular, it will be apparent to one skilled in the art that the inclusion of passive components in series with the transistors of the disclosed embodiments is within the scope of the invention.

I claim:

1. A low voltage analog switch comprising:
   a first transmission gate having a first N-channel transistor and a first P-channel transistor, each first and second transistor having respective drain and source terminals coupled together and forming switch drain and source terminals; and
   a second transmission gate comprising a second N-channel transistor coupled in series to a second P-channel transistor coupled in series to a third N-channel transistor, the second transmission gate being coupled in parallel to the switch drain and source terminals, the gates of the second and third N-channel transistors being coupled to a gate of the first N-channel transistor and a gate of the second P-channel transistor being coupled to a gate of the first P-channel transistor,
   wherein the second transmission gate is operable to reduce a minimum supply voltage of the switch, and wherein the first N-channel transistor and the first P-channel transistor are high threshold voltage transistors and wherein the second and third N-channel transistors and the second P-channel transistor are low threshold voltage transistors.

2. A low voltage analog switch as recited in claim 1 wherein the N-channel transistors are N-channel MOSFETs and the P-channel transistors are P-channel MOSFETs.

3. A low voltage analog switch as recited in claim 1 wherein the second transmission gate is operable to maintain a leakage off-current of the switch, and wherein the first N-channel transistor and the first P-channel transistor are higt-threshold voltage transistors and wherein the second and third N-channel transistors and the second P-channel transistor are low threshold voltage transistors.

4. A low voltage analog switch as recited in claim 1 wherein a positive rail of the supply voltage is coupled to the gate of the first N-channel transistor and a negative rail of the supply voltage is coupled to the gate of the second P-channel transistor.

5. A low voltage analog switch as recited in claim 1 wherein the threshold voltage of the second and third N-channel transistors is $\Delta V_{TN}$ less than the threshold voltage of the first N-channel transistor, the threshold voltage of the second P-channel transistor is $\Delta V_{TP}$ less than the threshold of the first P-channel transistor and the minimum supply voltage is greater than $\Delta V_{TN} + \Delta V_{TP}$.

6. A low voltage analog switch as recited in claim 1 wherein the threshold voltage of the second and third N-channel transistors is $\Delta V_{TN}$ less than the threshold voltage of the first N-channel transistor, the threshold voltage of the second P-channel transistor is $\Delta V_{TP}$ less than the threshold of the first P-channel transistor and the reduction in the minimum supply voltage is the lesser of $\Delta V_{TN}$ and $\Delta V_{TP}$.

7. A low voltage analog switch as recited in claim 1 wherein the threshold voltage of the second and third N-channel transistors is $\Delta V_{TN}$ less than the threshold voltage of the first N-channel transistor, the threshold voltage of the second P-channel transistor is $\Delta V_{TP}$ less than the threshold of the first P-channel transistor and the reduction in the minimum supply voltage is the lesser of $\Delta V_{TN}$ and $\Delta V_{TP}$ and wherein the minimum supply voltage is greater than $\Delta V_{TN}+\Delta V_{TP}$.

8. A low voltage analog switch as recited in claim 1 wherein the second transmission gate is operable to reduce a minimum supply voltage of the switch while maintaining a leakage off-current of the switch, and wherein the first N-channel transistor and the first P-channel transistor are high threshold voltage transistors and wherein the second and third N-channel transistors and the second P-channel transistor are low threshold voltage transistors.

9. A low voltage analog switch as recited in claim 8 wherein the leakage off-current of the switch is maintained over a rail-to-rail range of a switched signal.

10. A low voltage analog switch comprising:
   a first transmission gate having a first N-channel transistor and a first P-channel transistor, each first and second transistor having respective drain and source terminals coupled together and forming switch drain and source terminals; and
   a second transmission gate comprising a second P-channel transistor coupled in series to a second N-channel transistor coupled in series to a third P-channel transistor, the second transmission gate being coupled in parallel to the first transmission gate drain and source terminals, the gates of the second and third P-channel transistors being coupled to a gate of the first P-channel transistor and a gate of the second N-channel transistor being coupled to a gate of the first N-channel transistor,
   wherein the second transmission gate is operable to maintain a leakage off-current of the switch, and wherein the first N-channel transistor and the first P-channel transistor are high threshold voltage transistors and wherein the second and third P-channel transistors and the second N-channel transistor are low threshold voltage transistors.

11. A low voltage analog switch as recited in claim 10 wherein the N-channel transistors are N-channel MOSFETs and the P-channel transistors are P-channel MOSFETs.

12. A low voltage analog switch as recited in claim 10 wherein the second transmission gate is operable to reduce a minimum supply voltage of the switch while maintaining a leakage off-current of the switch, and wherein the first N-channel transistor and the first P-channel transistor are high threshold voltage transistors and wherein the second and third P-channel transistors and the second N-channel transistor are low threshold voltage transistors.

13. A low voltage analog switch as recited in claim 12 wherein the leakage off-current of the switch is maintained over a rail-to-rail range of a switched signal.

14. A low voltage analog switch as recited in claim 10 wherein the second transmission gate is operable to reduce a minimum supply voltage of the switch, and wherein the first N-channel transistor and the first P-channel transistor are high threshold voltage transistors and wherein the second and third P-channel transistors and the second N-channel transistor are low threshold voltage transistors.

15. A low voltage analog switch as recited in claim 14 wherein the threshold voltage of the second and third P-channel transistors is $\Delta V_{TP}$ less than the threshold voltage of the first P-channel transistor, the threshold voltage of the second N-channel transistor is $\Delta V_{TN}$ less than the threshold of the first N-channel transistor and the reduction in the minimum supply voltage is the lesser of $\Delta V_{TN}$ and $\Delta V_{TP}$.

16. A low voltage analog switch as recited in claim 14 wherein the threshold voltage of the second and third P-channel transistors is $\Delta V_{TP}$ less than the threshold voltage of the first P-channel transistor, the threshold voltage of the second N-channel transistor is $\Delta V_{TN}$ less than the threshold of the first N-channel transistor and the reduction in the minimum supply voltage is the lesser of $\Delta V_{TN}$ and $\Delta V_{TP}$ and wherein the minimum supply voltage is greater than $\Delta V_{TN}+\Delta V_{TP}$.

17. A low voltage analog switch as recited in claim 14 wherein a positive rail of the supply voltage is coupled to the gate of the first N-channel transistor and a negative rail of the supply voltage is coupled to the gate of the second P-channel transistor.

18. A low voltage analog switch as recited in claim 14 wherein the threshold voltage of the second and third P-channel transistors is $\Delta V_{TP}$ less than the threshold voltage of the first P-channel transistor, the threshold voltage of the second N-channel transistor is $\Delta V_{TN}$ less than the threshold of the first N-channel transistor and the minimum supply voltage is greater than $\Delta V_{TN}+\Delta V_{TP}$.

19. A method for reducing the supply voltage of an analog switch while maintaining the leakage off-current comprising the acts of:
   providing a first transmission gate having a first N-channel transistor and a first P-channel transistor, each first and second transistor having respective drain and source terminals coupled together and forming switch drain and source terminals;
   providing a second transmission gate comprising a second N-channel transistor coupled in series to a second P-channel transistor coupled in series to a third N-channel transistor;
   coupling the second transmission gate in parallel to the switch drain and source terminals, the gates of the second and third N-channel transistors being coupled to a gate of the first N-channel transistor and a gate of the second P-channel transistor being coupled to a gate of the first P-channel, wherein the first N-channel transistor and the first P-channel transistor are high threshold voltage transistors and wherein the second and third N-channel transistors and the second P-channel transistor are low threshold voltage transistors.

20. A method for reducing the supply voltage of an analog switch while maintaining the leakage off-current comprising the acts of:
   providing a first transmission gate having a first N-channel transistor and a first P-channel transistor, each first and second transistor having respective drain and source terminals coupled together and forming switch drain and source terminals;
   providing a second transmission gate comprising a second P-channel transistor coupled in series to a second N-channel transistor coupled in series to a third P-channel transistor;
   coupling the second transmission gate in parallel to the switch drain and source terminals, the gates of the second and third P-channel transistors being coupled to a gate of the first P-channel transistor and a gate of the second N-channel transistor being coupled to a gate of the first N-channel, wherein the first N-channel transistor and the first P-channel transistor are high threshold voltage transistors and wherein the second and third N-channel transistors and the second P-channel transistor are low threshold voltage transistors.

* * * * *